United States Patent
Mihara

(10) Patent No.: US 9,472,655 B1
(45) Date of Patent: Oct. 18, 2016

(54) METHOD FOR PRODUCING A SEMICONDUCTOR DEVICE

(71) Applicant: Renesas Electronics Corporation, Koutou-ku, Tokyo (JP)

(72) Inventor: Tatsuyoshi Mihara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/017,612

(22) Filed: Feb. 6, 2016

(30) Foreign Application Priority Data

Mar. 30, 2015 (JP) ................................. 2015-070432

(51) Int. Cl.
| H01L 21/8234 | (2006.01) |
| H01L 29/66 | (2006.01) |
| H01L 27/115 | (2006.01) |
| H01L 29/08 | (2006.01) |
| H01L 29/423 | (2006.01) |
| H01L 29/40 | (2006.01) |

(52) U.S. Cl.
CPC ... H01L 29/66833 (2013.01); H01L 27/11568 (2013.01); H01L 29/0847 (2013.01); H01L 29/401 (2013.01); H01L 29/42348 (2013.01); H01L 29/66545 (2013.01)

(58) Field of Classification Search
CPC ............. H01L 29/78; H01L 29/66833; H01L 29/66545; H01L 27/11568

USPC ......................................................... 438/275
See application file for complete search history.

(56) References Cited

U.S. PATENT DOCUMENTS

| 2007/0141796 | A1* | 6/2007 | Oh ......................... B82Y 10/00 438/296 |
| 2009/0309153 | A1 | 12/2009 | Yanagi et al. |
| 2016/0027651 | A1* | 1/2016 | Kawashima ........ H01L 27/1157 438/275 |
| 2016/0043098 | A1* | 2/2016 | Nakanishi ......... H01L 21/32133 438/283 |
| 2016/0086961 | A1* | 3/2016 | Owada .............. H01L 27/11546 438/258 |

FOREIGN PATENT DOCUMENTS

JP 2009-302269 A 12/2009

* cited by examiner

*Primary Examiner* — David S Blum
(74) *Attorney, Agent, or Firm* — Shapiro, Gabor and Rosenberger, PLLC

(57) ABSTRACT

An improvement is made in the reliability of a semiconductor device having a split gate type MONOS memory. An ONO film covering a control gate electrode, and a dummy memory electrode gates are formed, and then a diffusion region on a source-region-side of a memory to produced is formed across the dummy memory electrode gates. Subsequently, the dummy memory electrode gates is removed, and then a memory gate electrode is formed which is smaller in gate length than the dummy memory electrode gates. Thereafter, an extension region on the source-region-side of the memory is formed.

14 Claims, 8 Drawing Sheets

FIG. 15

| | ACTION MODE WRITING/ERASING | WRITING ACTION VOLTAGE (V) Vmg/Vs/Vcg/Vd/Vb | ERASING ACTION VOLTAGE (V) Vmg/Vs/Vcg/Vd/Vb | READING ACTION VOLTAGE (V) Vmg/Vs/Vcg/Vd/Vb |
|---|---|---|---|---|
| A | SSI (WRITING)/ BTBT (ERASING) | 10/5/11/0.5/0 | -6/6/0/OPEN/0 | 0/0/1.5/1.5/0 |
| B | SSI (WRITING)/ FN (ERASING) | 10/5/11/0.5/0 | 12/0/0/0/0 | 0/0/1.5/1.5/0 |
| C | FN (WRITING)/ BTBT (ERASING) | -12/0/0/0/0 | -6/6/0/OPEN/0 | 0/0/1.5/1.5/0 |
| D | FN (WRITING)/ FN (ERASING) | -12/0/0/0/0 | 12/0/0/0/0 | 0/0/1.5/1.5/0 |

METHOD FOR PRODUCING A SEMICONDUCTOR DEVICE

CROSS-REFERENCE TO RELATED APPLICATIONS

The disclosure of Japanese Patent Application No. 2015-070432 filed on Mar. 30, 2015 including the specification, drawings and abstract is incorporated herein by reference in its entirety.

BACKGROUND

The present invention relates to a method for producing a semiconductor device, and is usable for producing, for example, a semiconductor device having a nonvolatile memory.

As an electrically writable/erasable nonvolatile semiconductor memorizing unit, an EEPROM (electrically erasable and programmable read only memory) is widely used. Such a memorizing unit is a unit having a conductive floating gate electrode surrounded by an oxide film, or a trapping insulating film below a gate electrode of a MISFET, and is a unit in which a charge accumulating state in the floating gate or the trapping insulating film (charge holding part) is used as a memory data, and the data is read as a threshold of the transistor.

The trapping insulating film is an insulating film in which a charge can be accumulated. An example thereof is a silicon nitride film. By injecting a charge into such a charge accumulating region and discharging the charge therefrom, the threshold of the MISFET is shifted, thereby causing the MISFET to act as a memorizing element. An example of the trapping-insulating-film-used nonvolatile semiconductor memorizing unit is a split gate type cell using a MONOS (metal oxide nitride oxide semiconductor) film.

Patent Literature 1 (Japanese Unexamined Patent Application Publication No. 2009-302269) states that in a split gate type MONOS memory, a dummy ONO (oxide nitride oxide) film and a dummy memory gate electrode are formed, and thereafter ions are implanted into the workpiece to form source/drain regions and subsequently a memory gate electrode and an ONO film are re-formed into the workpiece.

In a process for producing split gate type MONOS memories, in the case of implanting ions into their workpiece across their memory gate electrodes in a non-crystalline state in order to form diffusion regions of their source/drain regions, the following problem is caused: when the ion implantation introduces an impurity into the non-crystalline state memory gate electrodes and then the memory gate electrodes are crystallized, crystal grains configured as the respective memory gate electrodes are varied in shape between these electrodes, so that properties of the memory cells may be unfavorably varied between the electrodes. Moreover, the impurity ions are implanted across the memory gate electrodes into an ONO film of the cells which includes a trapping insulating film, so that the cells are deteriorated in charge holding property and others.

In order to prevent these problems, known is a method of performing the following steps in turn: the steps of forming dummy memory gate electrodes in the workpiece; implanting ions thereinto for forming diffusion regions; removing the dummy memory gate electrodes; and forming memory gate electrodes and an ONTO film again.

However, when the dummy memory gate electrodes and the memory gate electrodes are formed to have substantially the same gate length, problems are caused that it is difficult to form LDD (lightly doped drain) structures, and further the memory cells are deteriorated in cut-off characteristic when not operated.

Other problems, and other novel features of the present invention will be made evident from the description of the present specification, and the attached drawings.

SUMMARY

A summary of a typical aspect of the present invention is in brief as follows:

The method of the aspect for producing a semiconductor device is a method of performing the following steps in turn when a split gate type MONOS memory is performed: the steps of forming a dummy memory gate electrode, and a source-region-side diffusion region of the memory in turn; removing the dummy memory gate electrode; forming a memory gate electrode; and forming an extension region of the source region side of the memory.

According to the aspect, the resultant semiconductor device can be improved in reliability.

BRIEF DESCRIPTION OF THE DRAWINGS

FIG. 15 is a table chart showing an example of conditions of voltages applied to individual moieties of a selected memory cell at the time of "writing", "erasing" and "reading".

DETAILED DESCRIPTION

Hereinafter, with reference to the drawings, an embodiment of the present invention will be described in detail. In all the drawings referred to for describing the embodiment, the same reference number is attached to the same members. About the same members, detailed overlapped descriptions thereabout will be omitted. In the embodiment, about parts or portions equivalent or similar to each other to each other, a repeated description is not made in principle unless especially needed.

Semiconductor devices in the present embodiment are each a semiconductor device having a nonvolatile memory (nonvolatile memorizing element, flash memory or nonvolatile semiconductor memorizing unit). The nonvolatile memory described herein is a split gate type MONOS memory (hereinafter referred to merely as a MONOS memory). The embodiment will be described about a case where the nonvolatile memory is a memory cell that is basically an n-channel type MISFET (metal insulator semiconductor field effect transistor).

In the present embodiment, the polarities (of applied voltage and the conductivity type of carriers at the time of writing, erasing and reading data) are those for describing actions of the memory cell, which is basically an n-channel type MISFET. When the nonvolatile memory is a memory cell that is basically a p-channel type MISFET, the same actions can be in principle gained by reversing the respective polarities of the applied voltage, the conductivity type of the carriers, and any other factor concerned to each other.

A mask referred to in the present invention denotes a protective film (etching mask) used to protect one or more out of objective matters from being etched, or a protective film (ion implantation blocking mask) used to protect one or more out of objective matters from being subjected to ion implantation.

<About Method for Producing Semiconductor Devices>

With reference to FIGS. 1 to 13, a description will be made about a method of the present embodiment for producing semiconductor devices.

FIGS. 1 to 13 are each a sectional view of a step in a semiconductor device production process according to the method of the present embodiment. The description made herein is about a case where n-channel type MISFETs (control transistors and memory transistors) are formed. However, by reversing the polarity of the conductivity type of the transistors, p-channel type MISFETs (control transistors and memory transistors) can be formed.

Figure 1:
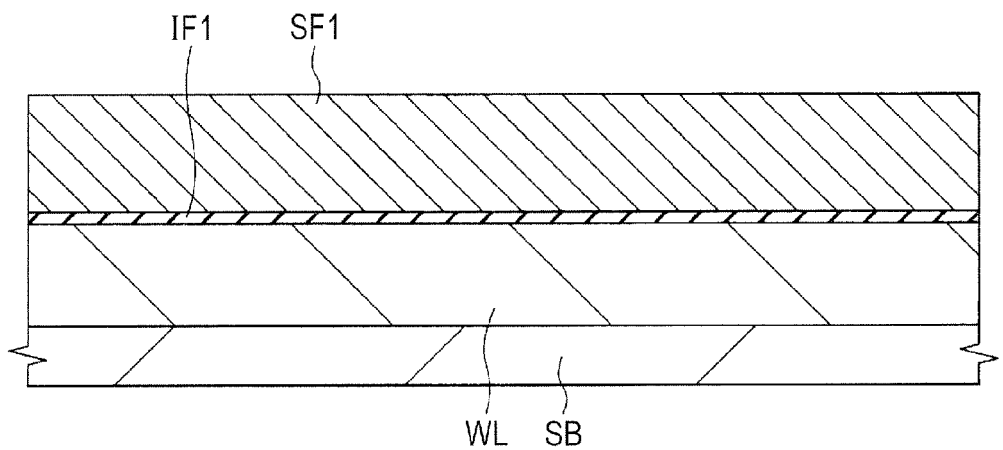
FIG. 1 is a sectional view illustrating a step in a semiconductor device producing method which is an embodiment of the present invention.

In the semiconductor device production process, as illustrated in FIG. 1, prepared is initially a semiconductor substrate (semiconductor wafer) SB having a specific resistivity of, for example, about 1 to 100 Ωcm and made of, for example, p-type monocrystal silicon (Si). Subsequently, trenches are made in a main surface of the semiconductor substrate SB, and element isolation regions (not illustrated) are formed in the trenches. The element isolation regions are made of, for example, a silicon oxide film, and can be formed by an STI (shallow trench isolation) method. However, the element isolation regions may be formed by, for example, a LOCUS (local-oxidization-of-silicon) method. A region illustrated in FIG. 1 is a region in which memory cells are to be later formed.

Subsequently, ions are implanted to the main surface of the semiconductor substrate SB to form a p-type well WL in the semiconductor substrate SB. The formation of the well WL is attained by implanting a p-type impurity (for example, B (boron)) to the main surface to have a relatively low concentration. The well WL is formed from the main surface of the semiconductor substrate SB to a middle depth of the semiconductor substrate SB. Thereafter, the semiconductor substrate SB is annealed to diffuse the impurity inside the well WL. For reference, in a region of the semiconductor substrate SB where p-type field effect transistors, or memory cells including the transistors, respectively, an n-type well is formed by implanting ions of an n-type impurity (for example, arsenic (Ar) or P (phosphorus)) to a main surface of the semiconductor substrate SB, which is neither illustrated nor detailed.

Subsequently, the workpiece is subjected to, for example, thermal oxidization to form an insulating film IF1 having a relatively small film thickness onto the upper surface of the semiconductor substrate SB, which is exposed. In this way, the upper surface of the semiconductor substrate SB is covered with the insulating film IF1. The insulating film IF1 is, for example, a silicon oxide film. Thereafter, for example, a CVD (chemical vapor deposition) method is used to form a silicon film SF1 over the whole of the main surface of the semiconductor substrate SB. In this way, the silicon film SF1 is formed over the semiconductor substrate SB to interpose the insulating film IF1 therebetween. The silicon film SF1 is a conductor film for forming control gate electrodes CG that will be later detailed.

It is allowable to form an amorphous silicon film, and subsequently anneal this amorphous silicon film to be changed to the silicon film SF1 that is a polycrystalline silicon film. The silicon film SF1 is rendered a low-resistance conductor film by implanting ions of an n-type impurity (for example, arsenic (As) or P (phosphorus)) into this film after the formation of the film without introducing any impurity into the film when the film is formed, and subsequently annealing the workpiece to diffuse the impurity.

Figure 2:
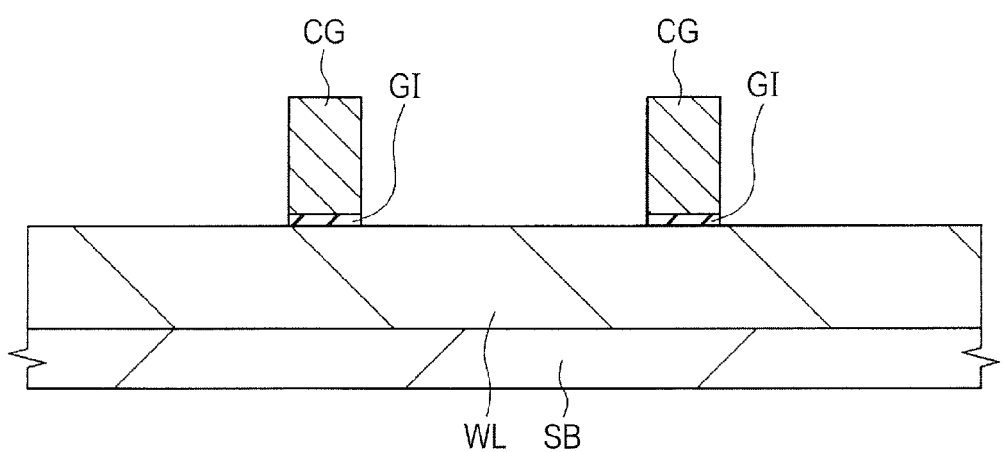
FIG. 2 is a sectional view illustrating a step after the step in FIG. 1.

Next, as illustrated in FIG. 2, a photolithographic technique and a dry etching method are used to etch the workpiece anisotropically, thereby removing each of the silicon film SF1 and the insulating film IF1 partially. In this way, the main surface of the semiconductor substrate SB is partially made exposed.

The silicon film SF1 is divided into plural patterns lined up in a first direction along the main surface of the semiconductor substrate SB. Each of these silicon film SF1 elements is configured as one of the control gate electrodes CG. Each of the formed control gate electrodes CG is extended in the direction along the main surface of the semiconductor substrate SB and in a second direction orthogonal to the first direction, that is, in a direction perpendicular to the paper surface of FIG. 2. Through this etching step, a gate insulating film G1 is also formed which is the insulating film IF1.

Figure 3:
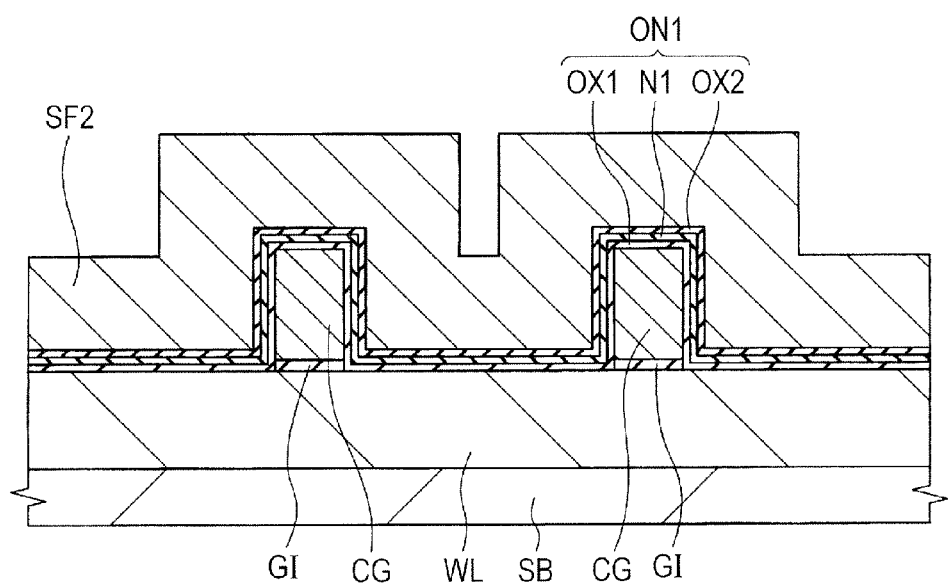
FIG. 3 is a sectional view illustrating a step after the step in FIG. 2.

Next, as illustrated in FIG. 3, an ONO (oxide-nitride-oxide) film ON1 is formed on the whole of the main surface of the semiconductor substrate SB, this film ON1 being a laminated film that is to be partially turned to the gate insulating film, which is a gate insulating film of memory transistors. The ONO film ON1 covers the upper surface of the semiconductor substrate SB, and any side surface and any upper surface of each laminated film that is made of the gate insulating film G1 and one of the control gate electrodes CG.

The ONO film ON1 is an insulating film having therein charge accumulating portions. Specifically, the ONO film ON1 is a laminated film made of a first silicon oxide film (bottom oxide film) OX1 formed on the semiconductor substrate SB, a silicon nitride film N1 formed on the first silicon oxide film OX1, and a sacrifice silicon oxide film (top oxide film) OX2 formed on the silicon nitride film N1. The silicon nitride film N1 is a trapping insulating film functioning as the charge accumulating part, that is, a charge accumulating film. The sacrifice silicon oxide film OX2 is a sacrifice film that will be removed in a subsequent step to be substituted with a different top oxide film configured as portions of the memory cells.

The first silicon oxide film OX1 and the sacrifice silicon oxide film OX2 can be formed by, for example, an oxidizing treatment (thermally oxidizing treatment), a CVD method, or a combination thereof. At this time, the oxidizing treatment may be ISSG oxidization. The silicon nitride film N1 can be formed by, for example, a CVD method. The thickness of each of the first silicon oxide film OX1 and the sacrifice silicon oxide film OX2 is, for example, from about 2 to 10 nm, and that of the silicon nitride film N1 is, for example, from about 5 to 15 nm.

Subsequently, for example, a CVD method is used to form a silicon film SF2 over the whole of the main surface of the semiconductor substrate SB to cover the outer surface of the ONO film ON1. In this way, any side wall and any upper surface of the ONO film ON1, which are exposed, are covered with the silicon film SF2. In other words, the silicon film SF2 is formed over the side walls of the control gate electrodes CG to interpose the ONO film ON1 therebetween. The film thickness of the silicon film SF2 formed in this step has a value equivalent to a value obtained by adding the gate length of a memory gate electrode configured as a part of each of the memory cells, which will be later formed, to the gate-length-direction width of a side wall made of an insulating film and adjacent to the memory gate electrode.

Figure 4:
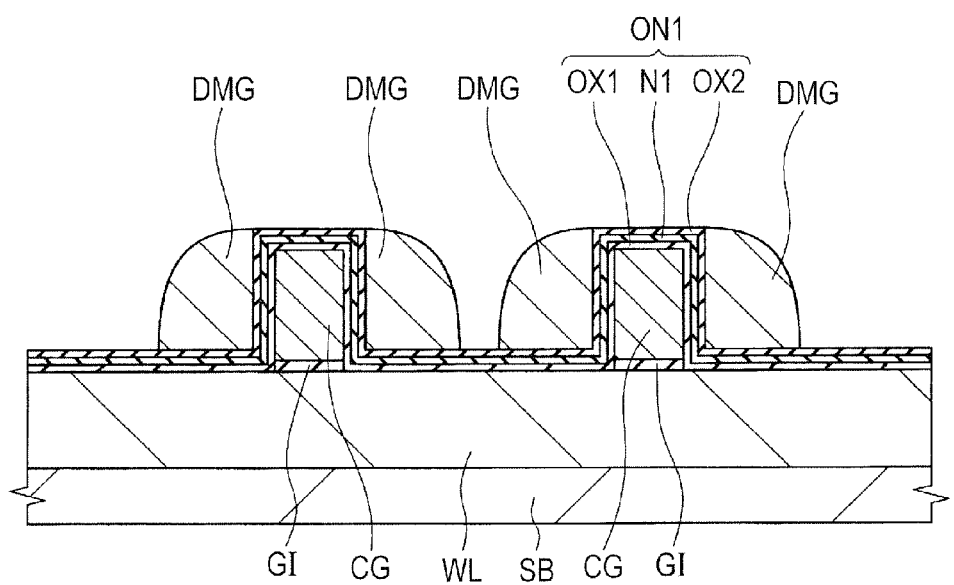
FIG. 4 is a sectional view illustrating a step after the step in FIG. 3.

Next, as illustrated in FIG. 4, the silicon film SF2 is etched back by a dry etching method to make the upper surface of the ONO film ON1 partially exposed. The partial surface made exposed in this step is the upper surface of ONO film ON1 portions contacting the main surface of the semiconductor substrate SB, and the upper surface of ONO film ON1 portions just above the control gate electrodes CG.

In this etching back step, by subjecting the silicon film SF2 to the etching back (anisotropic etching), the silicon film SF2 is caused to remain into a side wall form on the respective outer sides of both-side side walls of each laminated film structure made of the gate insulating film GI and one of the control gate electrodes CG to interpose the ONO film ON1 between the silicon film SF2 and the structure. The side-wall-form silicon film SF2 remaining after this operation is configured as dummy memory gate electrodes DMG. The dummy memory gate electrodes DMG correspond to a sacrifice film that will be removed in a subsequent step and be substituted with different memory gate electrodes configured as respective parts of the memory cells.

The gate length of each of the dummy memory gate electrodes DMG has a value equivalent to a value obtained by adding the gate length of the memory gate electrode configured as a part of the memory cells, which will be later formed, to the gate-length-direction width of the side wall, which is is made of the insulating film and is adjacent to the memory gate electrode.

Figure 5:
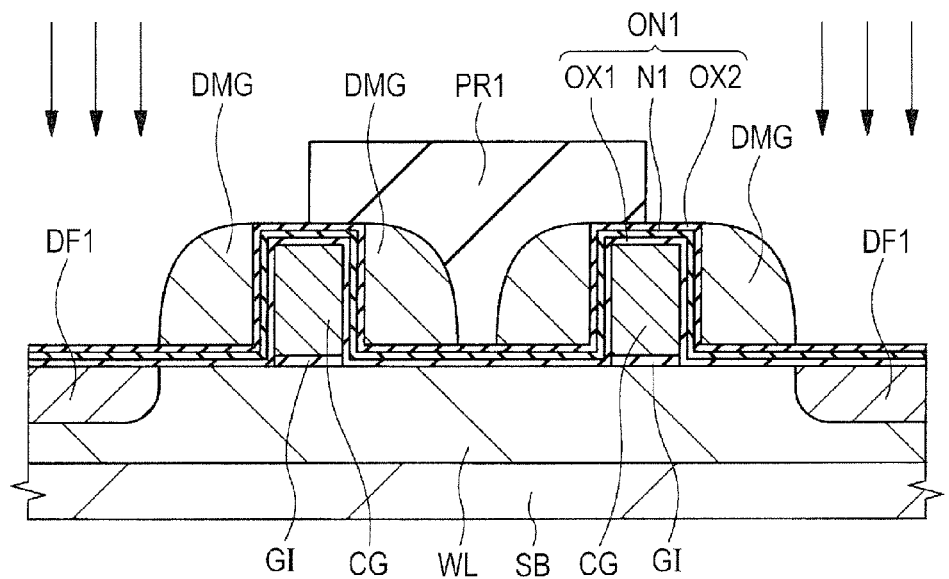
FIG. 5 is a sectional view illustrating a step after the step in FIG. 4.

Next, as illustrated in FIG. 5, a photoresist film PR1 is formed to cover the dummy memory gate electrode DMG adjacent to one of the both-side side walls of each of the control gate electrodes CG. The photoresist film PR1 covers the whole of this one-side dummy memory gate electrode DMG, and makes the other dummy memory gate electrode DMG exposed. One of the first-direction ends of the photoresist film PR1 is terminated just above a portion of the ONO film ON1 on the control gate electrode CG.

Thereafter, the photoresist film PR1 is used as a mask to implant ions into the workpiece, thereby forming diffusion regions (impurity diffusion regions, or $n^+$-type semiconductor regions) DF1 into the main surface of the semiconductor substrate SB. Subsequently, the photoresist film PR1 is removed. The diffusion regions DF1 are each a semiconductor region configured as a source region of each of the memory cells, which will be later formed.

Specifically, the photoresist film PR1, portions of the control gate electrodes CG and portions of the dummy memory gate electrodes DMG are used as a mask to introduce n-type impurities (arsenic (As) and phosphorus (P)) into the main surface of the semiconductor substrate SB by an ion implanting method to give a relatively high concentration. The impurity ions hit at this time are passed through the ONO film ON1 made exposed from the photoresist film PR1 and the dummy memory gate electrodes DMG to be implanted into the main surface of the semiconductor substrate SB. In this way, the diffusion regions DF1 are formed.

The reason why in this ion implanting step the two impurity ion species of arsenic (As) and phosphorus (P) are introduced as the n-type impurities to form the diffusion regions DF1 is that the memory cells, which will be later formed, are improved in leakage property. In such a case, implanting conditions for implanting the impurity ions of phosphorus are set as follows: an implanting energy of 10 keV and a dose of $2\times10^{15}$ cm$^{-2}$. Implanting conditions for implanting the impurity ions of arsenic are set as follows: an implanting energy of 20 keV and a dose of $2\times10^{15}$ cm$^{-2}$.

In this step, the impurity ions are implanted into portions of the ONO film ON1 that are made exposed from the photoresist film PR1 and the dummy memory gate electrodes DMG to give a relatively high concentration. As a result, the ONO film ON1 is damaged. When the ONO film ON1 having the thus damaged portions is used as a charge holding film, a problem is caused that the film is deteriorated in charge holding property.

Additionally, the depth of the formed diffusion regions DF1 is relatively large so that in the diffusion-region-DF1-forming step, the impurity ions may be passed through the inside of the dummy memory gate electrodes DMG portions made exposed from the photoresist film PR1 to be implanted into sacrifice silicon oxide film OX2 portions just below the dummy memory gate electrodes DMG. In this case, the sacrifice silicon oxide film OX2 is damaged. As a result, when this sacrifice silicon oxide film OX2 is used as a top oxide film of a charge holding film of the memory cells, a problem is caused that this film OX2 is deteriorated in charge holding property. In this case, the impurity ions are introduced also into silicon nitride film N1 portions and first silicon oxide film OX1 portions just below the dummy memory gate electrodes DMG.

Just after the formation of the diffusion regions DF1, annealing for activating the diffusion regions DF1 is not performed. The activating annealing to the impurity-implanted semiconductor regions will be performed after a source/drain-region-forming step that will be later detailed with reference to FIG. 11.

Figure 6:
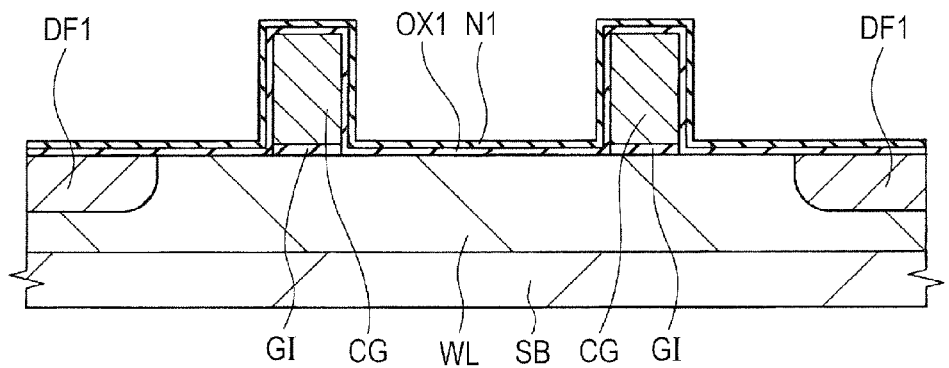
FIG. 6 is a sectional view illustrating a step after the step in FIG. 5.

Next, as illustrated in FIG. 6, the workpiece is subjected to, for example, wet etching to remove each of the dummy memory gate electrodes DMG formed adjacent to the both-side side walls of each of the control gate electrodes CG. Thereafter, the sacrifice silicon oxide film OX2 is removed. In this way, the silicon nitride film N1 is made exposed.

Figure 7:
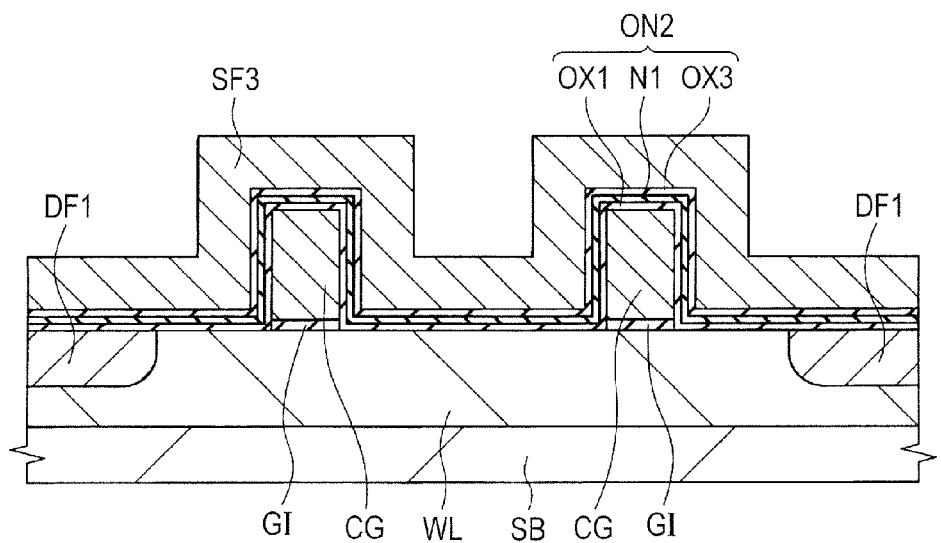
FIG. 7 is a sectional view illustrating a step after the step in FIG. 6.

Next, as illustrated in FIG. 7, a second oxide silicon film (top oxide film) OX3 is formed over the whole of the main surface of the semiconductor substrate SB to cover the outer surface of the silicon nitride film N1, using, for example, a CVD method. In this way, the exposed side walls and upper surface of the silicon nitride film N1 are covered with the second oxide silicon film OX3. The first silicon oxide film OX1, the silicon nitride film N1 and the second oxide silicon film OX3 are configured as an ONO film ON2.

Subsequently, a silicon film SF3 is formed over the whole of the main surface of the semiconductor substrate SB, using, for example, a CVD method. In this way, the exposed side walls and upper surface of the ONO film ON2 are covered with the silicon film SF3. In other words, the silicon film SF3 is formed over the side walls of the control gate electrodes CG to interpose the ONO film ON2 therebetween. The silicon film SF3 is formed as a non-doped amorphous silicon film at the time of the formation. In short, the silicon film SF3 is an intrinsic semiconductor when formed. Moreover, the silicon film SF3 is a film which is to be poly-crystallized into a polysilicon film by effect of, for example, annealing to be performed after the formation of source/drain regions which will be later detailed with reference to FIG. 11.

The silicon film SF3 is smaller in film thickness than the silicon film SF2 illustrated in FIG. 3.

The wording "film thickness" as described herein denotes, when a film having the film thickness is a specified film, the thickness of the film in a direction perpendicular to the outer surface of an underlay of the film. For example, when a portion of the silicon film SF3 is formed on, for example, the upper surface of the ONO film ON2 or any other surface along the main surface of the semiconductor substrate SB to be along the upper surface or the other surface, the film thickness of the silicon film SF3 denotes the thickness of the silicon film SF3 in a direction perpendicular to the main surface of the semiconductor substrate SB. In the case of a portion of the silicon film SF3 that is formed to contact any one of the side walls of the ONO film ON2 or any other wall perpendicular to the main surface of the semiconductor substrate SB, the film thickness of the silicon film SF3 denotes the thickness of the silicon film SF3 in a direction perpendicular to the side wall.

Figure 8:
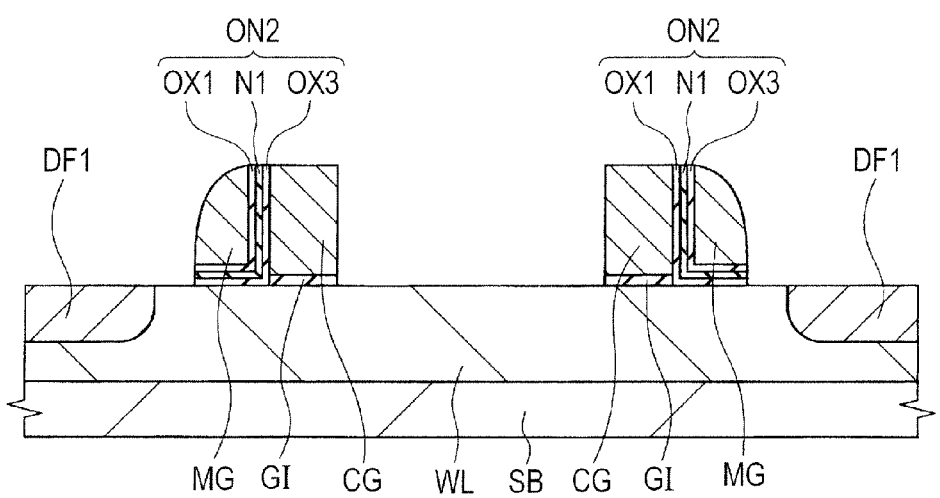
FIG. 8 is a sectional view illustrating a step after the step in FIG. 7.

Next, as illustrated in FIG. 8, the silicon film SF3 is etched back by a dry etching method to make the upper surface of the ONO film ON2 partially exposed. The partial surface made exposed in this step is the upper surface of ONO film ON2 portions contacting the main surface of the semiconductor substrate SB, and the upper surface of ONO film ON2 portions just above the control gate electrodes CG.

In this etching back step, by subjecting the silicon film SF3 to the etching back (anisotropic etching), the silicon film SF3 is caused to remain in a side wall form on a side of one of the both-side side walls of each of the laminated film structures, which is made of the gate insulating film GI and one of the control gate electrodes CG, to interpose the ONO film ON2 between the silicon film SF3 and the laminated film structure. In this way, a memory gate electrode MG made of the silicon film SF3 remaining in the side wall form is formed onto one of the both-side side walls of the laminated film to interpose the ONO film ON2 between the side wall and the electrode MG.

Subsequently, a photolithographic technique is used to form, over the semiconductor substrate SB, a photoresist pattern (not illustrated) that covers the memory gate electrode MG adjacent to one of both the side walls of each of the control gate electrodes CG, and that makes the silicon film SF3 adjacent to the other side wall of the control gate electrode CG exposed. Thereafter, the photoresist pattern is used as an etching mask to remove the silicon film SF3 formed at a side of the workpiece that is opposite, across the control gate electrode CG, to the memory gate electrode MG side of the workpiece. Thereafter, the photoresist pattern is removed. Since the memory gate electrode MG is covered with the photoresist pattern at this time, the memory gate electrode MG remains without being etched.

Subsequently, portions of the ONO film ON2 that are exposed without being covered with the memory gate electrodes MG are etched (for example, wet-etched) to be removed. At this time, ONO film ON2 portions just below the memory gate electrodes MG remain without being removed. In the same manner, portions of the ONO film ON2 remain which are each positioned between the laminated film structure, which includes the gate insulating film GI and one of the control gate electrodes CG, and the corresponding memory gate electrode MG. The other portions or regions of the ONO film ON2 are removed so that the upper surface of the semiconductor substrate SB is made exposed, and further the respective upper surfaces of the control gate electrodes CG are made exposed. Out of the side walls of each of the control gate electrodes CG, a side wall uncovered with any one of the memory gate electrodes MG is made exposed.

At this time, the ONO film ON1 is wholly removed, which has received the ion implantation since this film has been made exposed from the photoresist film PR1 and the dummy memory gate electrodes DMG in the ion implanting step described with reference to FIG. 5.

Each of the memory gate electrodes MG, and the corresponding diffusion region DF1 are apart from each other in the gate-length-direction (first direction) of the memory gate electrode MG. This is because the gate length of each of the dummy memory gate electrodes DMG used as the mask in the ion implanting step described with reference to FIG. 5 is longer than that of each of the memory gate electrodes MG. The herein-described gate length of the dummy memory gate electrode DMG denotes the gate-length-direction (first-direction) width of the dummy memory gate electrode DMG, this gate-length-direction being the gate-length-direction of the control gate electrodes CG.

As described above, each of the memory gate electrodes MG is formed over the semiconductor substrate SB to be adjacent to one of the control gate electrodes CG and to interpose the ONO film ON2, which has therein the charge accumulating portions, between the semiconductor substrate SB and the memory gate electrode MG. The memory gate electrode MG is formed in a region adjacent to the control gate electrode CG and over the main surface of the semiconductor substrate SB to interpose the ONO film ON2 between the memory gate electrode MG and the semiconductor substrate SB. In short, the ONO film ON2 has an L-shaped sectional shape.

Figure 9:
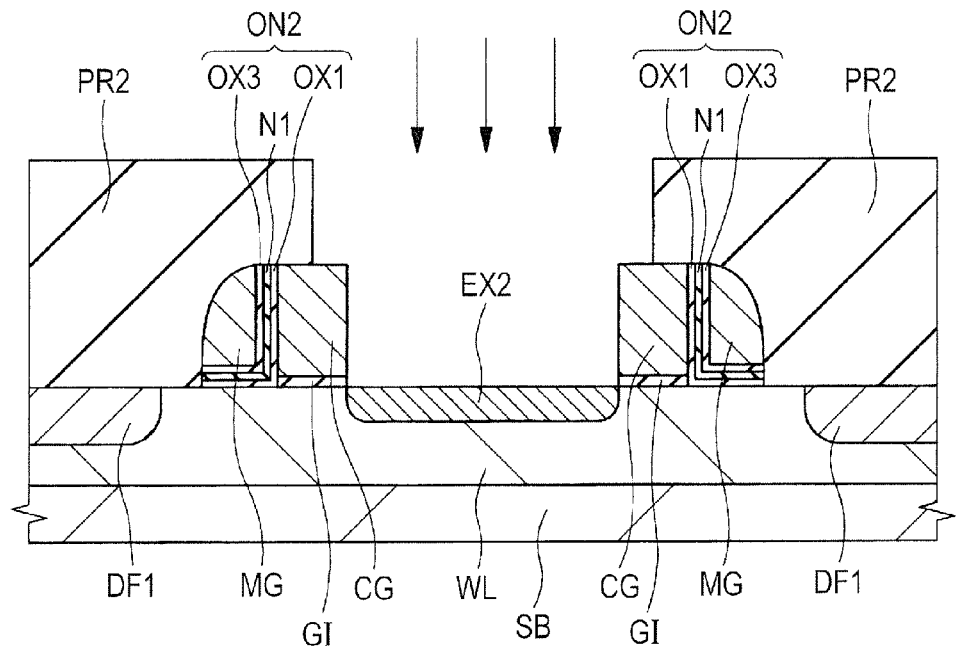
FIG. 9 is a sectional view illustrating a step after the step in FIG. 8.

Next, as illustrated in FIG. 9, a photolithographic technique is used to form a photoresist film PR2 over the semiconductor substrate SB. The photoresist film PR2 is a film which is terminated just above each of the control gate electrodes CG and covers the corresponding diffusion region DF1 and memory gate electrode MG. In other words, the photoresist film PR2 makes the following out of regions on sides of the control gate electrode CG exposed: a main surface region of the semiconductor substrate SB where the memory gate electrode MG and the diffusion region DF1 are not formed.

Subsequently, the photoresist film PR2 is used as a mask to implant ions into the workpiece to form extension regions (impurity diffusion regions, or n⁻-type semiconductor regions) EX2 in the main surface of the semiconductor substrate SB. Specifically, the photoresist film PR2 and portions of the control gate electrodes CG are used as a mask (ion implantation blocking mask) to introduce an n-type impurity such as arsenic (As) into the main surface of the semiconductor substrate SB by an ion implanting method, thereby forming the extension regions EX2. Thereafter, the photoresist film PR2 is removed.

Before the formation of the photoresist film PR2 and the extension regions EX2, for example, a silicon nitride film, a silicon oxide film, or a laminated film of the two films may be used to form an offset spacer for covering side walls of each structures made of the gate insulating film GI, one of the control gate electrodes CG, the ONO film ON2, and the memory gate electrode MG corresponding to the electrode CG, this situation being not illustrated.

Figure 10:
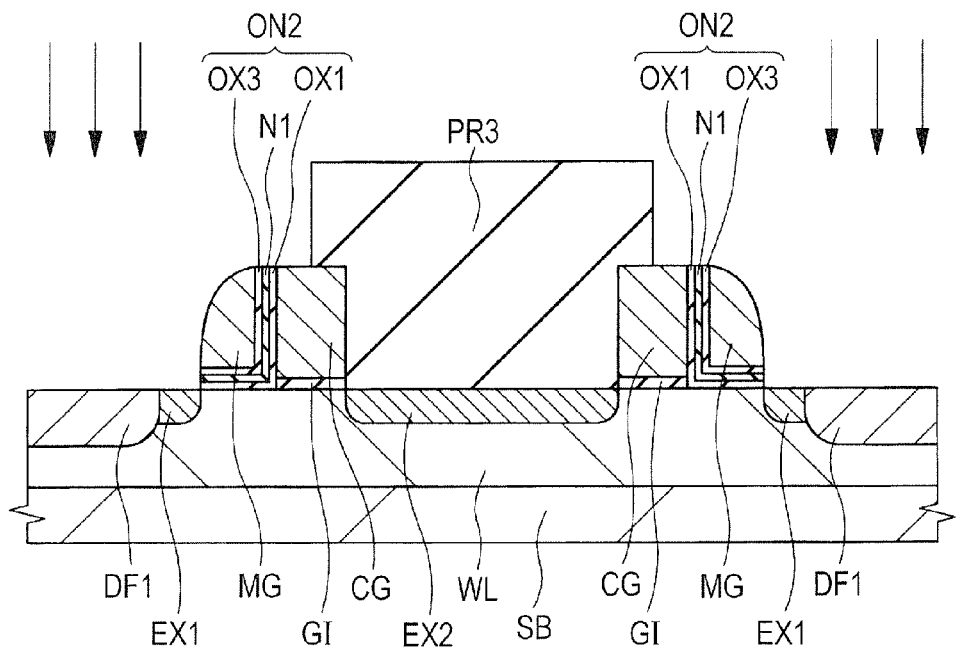
FIG. 10 is a sectional view illustrating a step after the step in FIG. 9.

Next, as illustrated in FIG. 10, a photolithographic technique is used to form a photoresist film PR3 over the semiconductor substrate SB. The photoresist film PR3 is a film which is terminated just above each of the control gate electrodes CG, covers the corresponding extension region EX2, and makes the corresponding diffusion regions DF1 and memory gate electrode MG exposed. In other words, the photoresist film PR3 makes the following out of regions on sides of the control gate electrode CG exposed: a main surface SB region of the semiconductor substrate SB where the memory gate electrode MG and the diffusion region DF1 are formed.

Subsequently, the photoresist film PR3 is used as a mask to implant ions into the workpiece to form extension regions (impurity diffusion regions, or n⁻-type semiconductor regions) EX1 in the main surface of the semiconductor substrate SB. Specifically, the photoresist film PR3, portions of the control gate electrodes CG, the memory gate electrodes MG and others are used as a mask (ion implantation blocking mask) to introduce an n-type impurity such as arsenic (As) into the main surface of the semiconductor substrate SB by an ion implanting method, thereby forming the extension regions EX1. Thereafter, the photoresist film PR3 is removed.

The extension regions EX1 are formed by ion implantation at a lower dose and a lower energy than by the ion implantation performed to form the diffusion regions DF1. Accordingly, the impurity ions hit onto the respective upper surfaces of the memory gate electrodes MG in the step of forming the extension regions EX1 do not reach the respective lower surfaces of the memory gate electrodes MG.

The ions of phosphorus (P) and arsenic (As) as impurities have been introduced into the first silicon oxide film OX1 and the silicon nitride film N1 by the ion implantation described with reference to FIG. 5. However, the memory gate electrodes MG are not used as the mask for forming the diffusion regions, and are used as a mask only in the ion implanting step of hitting arsenic (As) to form the extension regions EX1.

Accordingly, the ratio of the phosphorus (P) concentration to the arsenic (As) concentration in the memory gate electrodes MG is smaller than the ratio of the phosphorus (P) concentration to the arsenic (As) concentration in each of the first silicon oxide film OX1 and the silicon nitride film N1. In other words, the ratio of the phosphorus (P) concentration to the arsenic (As) concentration in the memory gate electrodes MG is smaller than the ratio of the phosphorus (P) concentration to the arsenic (As) concentration in the ONO film ON2. This matter is also true in the memory cells that will have been completed.

Consequently, the second oxide silicon film OX3 is lower in impurity concentration than the first silicon oxide film OX1 and the silicon nitride film N1. This matter is also true in the memory cells, which will have been completed.

Figure 11:
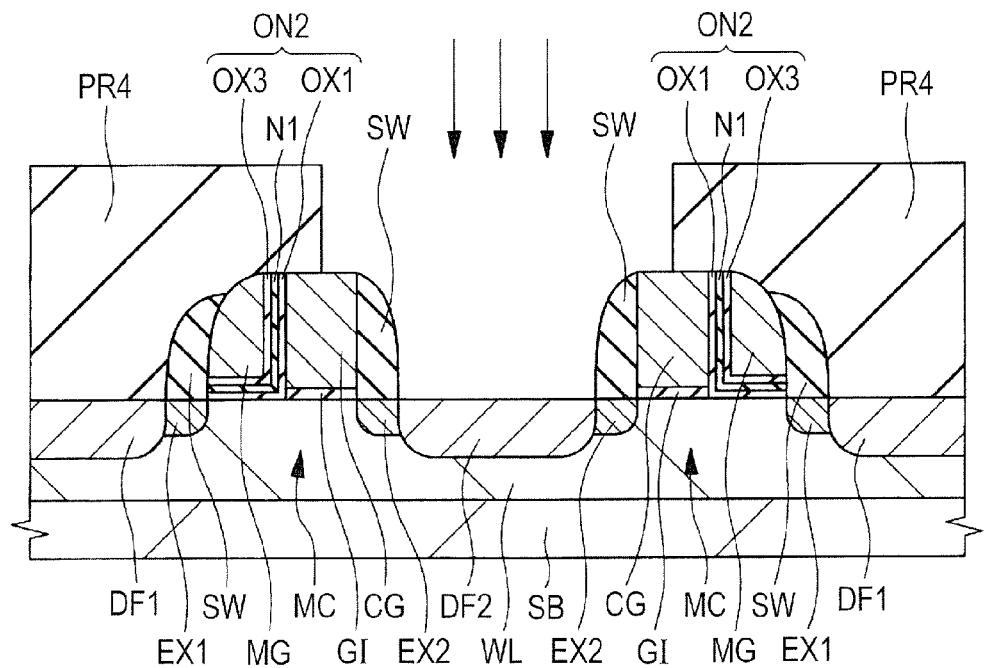
FIG. 11 is a sectional view illustrating a step after the step in FIG. 10.

Next, as illustrated in FIG. 11, side walls SW are formed which are each an insulating film covering respective side walls of each of the above-mentioned structures on both sides of the structure. The side walls SW can be formed in a self-alignment manner by using, for example, a CVD method to form, for example, a silicon oxide film and a silicon nitride film in turn over the semiconductor substrate SB, and removing the silicon oxide film and the silicon nitride film partially by anisotropic etching, thereby making the respective upper surfaces of the semiconductor substrate SB, the control gate electrodes CG and the memory gate electrodes MG exposed.

In conclusion, one of the paired side walls SW is formed to contact one of the side walls of the memory gate electrode MG of the structure while the other side wall SW is formed to contact one of the side walls of the control gate electrodes CG thereof. It is conceivable that a laminated film is used to form the side walls. However, in the figure, an interface between films configured as the laminated film is not illustrated.

Subsequently, a photolithographic technique is used to form a photoresist film PR4 over the semiconductor substrate SB. The photoresist film PR4 is a film which is terminated just above each of the control gate electrodes CG, covers the corresponding extension region EX1, diffusion region DF1 and memory gate electrode MG, and the side wall adjacent to the memory gate electrode MG, and makes the side wall SW adjacent to the control gate electrode CG, and the corresponding extension region EX2 exposed. In other words, the photoresist film PR4 is a protective film for making the following out of regions on sides of the control gate electrode CG exposed: a main surface SB region of the semiconductor substrate SB where the extension region EX2 is formed.

Subsequently, the photoresist film PR4 is used as a mask to implant ions into the workpiece to form diffusion regions (impurity diffusion regions or n⁺-type semiconductor regions) in the main surface of the semiconductor substrate SB.

Specifically, the photoresist film PR4, portions of the control gate electrodes CG, the side walls SW and others are used as a mask to introduce n-type impurities (arsenic (As) and phosphorus (P)) into the main surface of the semiconductor substrate SB by an ion implanting method to give a relatively high concentration. Thereafter, the photoresist film PR4 is removed.

The reason why in this ion implanting step the two impurity ion species of arsenic (As) and phosphorus (P) are introduced as the n-type impurities to form the diffusion regions DF2 is that the memory cells referred to above, which are memory cells MC in FIG. 11, are improved in leakage property. In such a case, implanting conditions for implanting the impurity ions of phosphorus are set as follows: an implanting energy of 10 keV and a dose of $2 \times 10^{15}$ cm$^{-2}$. Implanting conditions for implanting the impurity ions of arsenic are set as follows: an implanting energy of 20 keV and a dose of $2 \times 10^{15}$ cm$^{-2}$.

Each of the extension regions EX1 and EX2 are smaller in extension-region-formed depth (junction depth) than any one of the diffusion regions DF1 and Df2. Each of the extension regions EX1 is formed to contact the corresponding diffusion region DF1, and each of the extension regions EX2 is formed to contact the corresponding diffusion region DF2. In this way, the following are configured as paired source-drain regions: the extension region EX1 and the diffusion region DF1, which is a diffusion layer higher in impurity concentration than the extension region EX1; and the extension region EX2 and the diffusion region DF2, which is a diffusion layer higher in impurity concentration than the extension region EX2. The source drain regions have an LDD (lightly doped drain).

In short, between the diffusion region DF1 and the diffusion region DF2, the extension regions EX1 and EX2 are formed to be lined up. Moreover, the well WL between the extension regions EX1 and EX2 and near the main surface of the semiconductor substrate SB is a channel region in which a channel is formed when the memory cell MC concerned acts.

The control transistors and the memory transistors are each configured as a MISFET. In the MISFET, a diffusion region relatively high in impurity concentration and an extension region relatively low in impurity concentration are configured as source/drain regions, and the extension region is formed at a position nearer to the channel region of the MISFET than the diffusion region, so that the depth of the formed diffusion region can be made small while an increase in the resistance value of the source/drain regions can be prevented. Moreover, the generation of hot electrons can be prevented. Accordingly, the formation of the LDD structure makes it possible to heighten the short channel MISFET in reliability to produce an advantageous effect that the semiconductor device concerned is easily made fine.

Subsequently, the workpiece is subjected to activating annealing, which is a thermal treatment for activating the impurities introduced into, for example, the semiconductor regions (the extension regions EX1 and EX2, and the diffusion regions DF1 and DF2) configured as the source regions and drain regions.

Each of the control gate electrodes CG, and the paired source/drain regions on sides of the control gate electrode CG are configured as one of the control transistors. Each of the memory gate electrodes MG, and the paired source/drain regions on sides of the memory gate electrode MG are configured as one of the memory transistors. Specifically, each of the extension regions EX1, and the corresponding diffusion region DF1 are configured as the source region of any one of the control transistors and the memory transistors; and each of the extension regions EX2, and the corresponding diffusion region DF2 are configured as the drain region of any one of the control transistors and the memory transistors.

The control transistors and the memory transistors are each configured as one of the memory cells MC, which are memory cells of a split gate type MONOS memory. Thus, through the above-mentioned process, the memory cells MS can be produced.

In the present embodiment, the memory gate electrodes MG are not used as the mask for forming the diffusion regions, and are used as the mask only in the ion implanting step for forming the extension regions EX1. Thus, the memory gate electrodes MG are smaller in impurity concentration than each of the diffusion regions DF1 and DF2. This is also true in the completed memory cells.

Phosphorus (P) and arsenic (As), which are impurity ions, are introduced into the first silicon oxide film OX1 and the silicon nitride film N1 by the ion implantation described with reference to FIG. 5; however, after the formation of the second oxide silicon film OX3, the memory gate electrodes MG on the second oxide silicon film OX3 are not used as a mask for forming any diffusion region. Furthermore, as described above, in the ion implanting step for forming the extension regions EX1, the impurity ions hit onto the respective upper surfaces of the memory gate electrodes MG do not reach the second oxide silicon film OX3.

Figure 12:
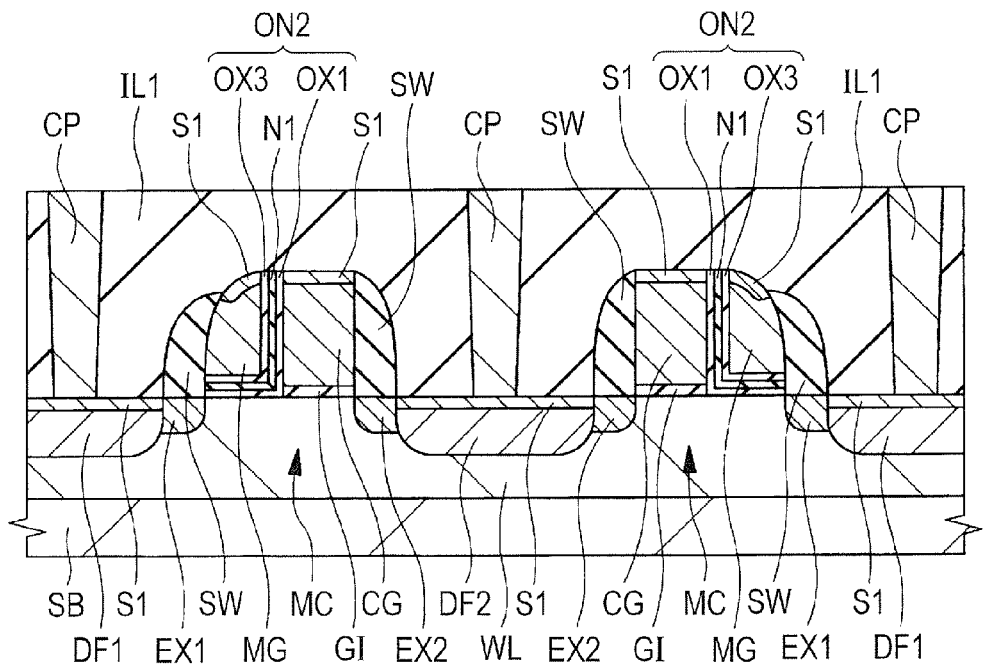
FIG. 12 is a sectional view illustrating a step after the step in FIG. 11

Next, as illustrated in FIG. 12, a silicide layer S1 is formed. The silicide layer S1 can be formed by performing the so-called silicide (self aligned silicide) process. Specifically, the silicide layer S1 can be formed as follows:

Initially, a metal film for forming the silicide layer S1 is formed (deposited) over the whole of the main surface of the semiconductor substrate SB, which includes the respective upper surfaces of the diffusion regions DF1 and DF2, the control gate electrodes CG and the memory gate electrodes MG. The metal film may be a film of a simple-metal film (pure metal film), or an alloy film. The metal film is, for example, a cobalt (Co) film, a nickel (Ni) film or a nickel platinum alloy film, and can be formed by, for example, sputtering.

Thereafter, the semiconductor substrate SB is subjected to annealing (annealing for forming the silicide layer Si) to cause the metal film to react with the respective outer-surface-moieties of the diffusion regions DF1 and DF2, the control gate electrodes CG and the memory gate electrodes MG. In this way, the silicide layer is completed to contact the respective upper surfaces of the diffusion regions DF1 and DF2, the control gate electrodes CG and the memory gate electrodes MG. Thereafter, for example, wet etching is used to remove an unreacted portion of the metal film to yield a structure illustrated in FIG. 12. The silicide layer S1 may be rendered, for example, a cobalt silicide film, a nickel silicide film or a nickel platinum silicide film.

Subsequently, an interlayer dielectric IL1 is formed over the whole of the main surface of the semiconductor substrate SB to cover the memory cells MC. The interlayer dielectric IL1 is, for example, a simple-substance film such as a silicon oxide film, and can be formed by, for example, a CVD method. The formation of the interlayer dielectric IL1 is attained to give, for example, a film thickness larger than that of the control gate electrodes CG.

Subsequently, for example, a CMP (chemical mechanical polishing) method is used to polish the upper surface of the interlayer dielectric IL1. Thereafter, plural contact plugs CP are formed.

Specifically, a photoresist pattern (not illustrated) formed on the interlayer dielectric IL1 by use of a photolithographic technique is used as an etching mask to dry-etch the interlayer dielectric IL1. In this way, contact holes (openings or through holes) are made which penetrate the interlayer dielectric IL1.

In the bottom of each of the contact holes, for example, the following is made exposed: a portion of the silicide layer S1 on the respective upper surfaces of the diffusion regions DF1 and DF2, which are portions of the main surface of the semiconductor substrate SB; a portion of the silicide layer S1 on the upper surfaces of the control gate electrodes CG; or a portion of the silicide layer S1 on the upper surfaces of the memory gate electrodes MG.

Subsequently, the contact plugs CP referred to above, which are made of, for example, tungsten (W) to be conductive, are formed, as conductors for coupling, in the contact holes, respectively. For example, a barrier conductor film (for example, a titanium film, a titanium nitride film or a laminated film of the two) is formed onto the interlayer dielectric IL1 including the contact holes, so as to be formed also inside the contact holes. Thereafter, a main conductor film which is, for example, a tungsten film is formed on the barrier conductor film to embed the individual contact holes completely, and then unnecessary portions of the main conductor film and the barrier conductor film, the portions being outside the contact holes, are removed by, for example, a CMP method or etching back method. In this way, the contact plugs CP can be completed.

The contact plugs CP embedded in the contact holes are electrically coupled through the silicide layer S1 to the respective upper surfaces of the diffusion regions DF1 and DF2, the control gate electrodes CG and the memory gate electrodes MG. Each of the contact plugs CP is coupled to the upper surface of the silicide layer S1 on one of the diffusion regions DF1, the upper surface of the silicide layer S1 on one of the diffusion regions DF2, the upper surface of the silicide layer S1 on one of the control gate electrodes CG, the upper surface of the silicide layer S1 on one of the memory gate electrodes MG, or some other.

In order to make the illustration of FIG. 12 simple, the barrier conductor film and the main conductor film (tungsten film) configured as the contact plugs CP are illustrated to be integrated with each other. In the sectional view of FIG. 12, the contact plugs CP coupled, respectively, to the control gate electrodes CG and the memory gate electrodes MG are not illustrated. In other words, some of the entire contact plugs CP are connected, in regions not illustrated, to the control gate electrodes CG and the memory gate electrodes MG extended in the gate width direction.

Figure 13:
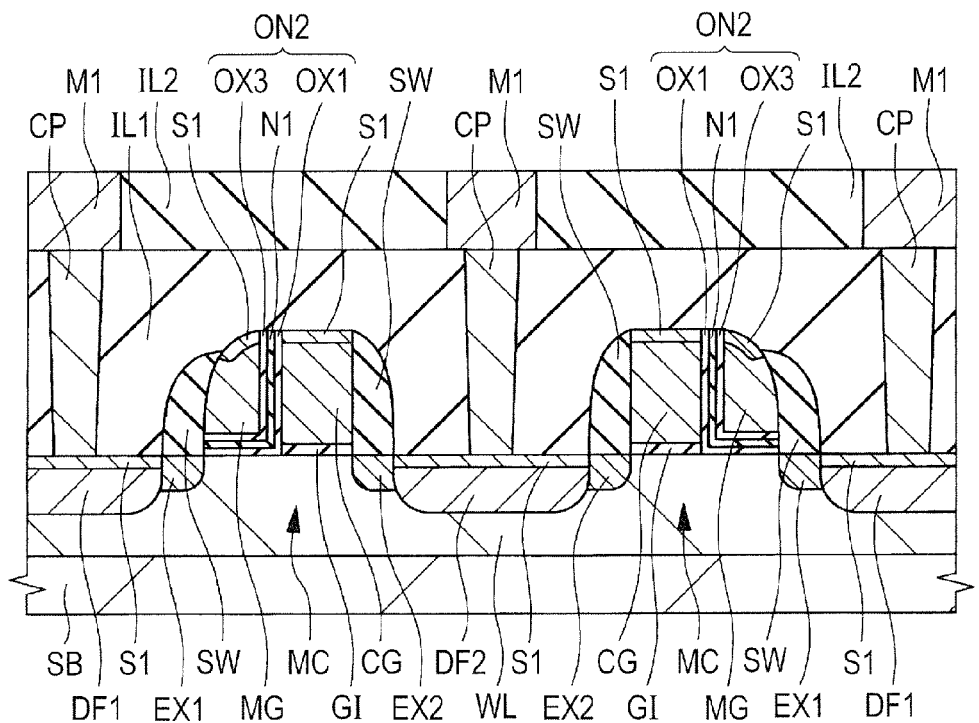
FIG. 13 is a sectional view illustrating a step after the step in FIG. 12.

Next, as illustrated in FIG. 13, a first interconnect layer including first-layer interconnects M1 is formed on the interlayer dielectric IL1 in which the contact plugs CP are embedded. The interconnects M1 may be formed by the so-called single damascene technique. The first interconnect layer has an interlayer dielectric IL2, and the first-layer interconnects M1, which penetrates the interlayer dielectric IL2. The respective bottom surfaces of the interconnects M1 are coupled to the upper surfaces of the contact plugs CP, respectively. Although the illustration of subsequent steps is omitted, a second interconnect layer, a third interconnect layer and others are formed in turn over the first interconnect layer to form a laminated interconnect layer. Thereafter, the workpiece is divided into individual pieces in a dicing step. In this way, plural semiconductor chips are yielded. Through the process described hereinbefore, the semiconductor devices in the present embodiment are produced.

<About Action of Each Nonvolatile Memory>

Referring to FIG. 15, the following will describe an action example of each of the above-mentioned nonvolatile memories.

FIG. 15 is a table chart showing an example of conditions of voltages to be applied to individual moieties of a selected memory cell, out of the memory cells, at the time of "writing", "erasing" and "reading" in the present embodiment. In the table of FIG. 15, at each of the "writing", "erasing" and "reading" times, voltages Vmg, Vs, VCG and Vd, and base voltage Vb are described which are, respectively, a voltage applied to the memory gate electrode MG of the memory cell, which is a memory cell MC as illustrated in FIG. 13, one applied to the source region thereof, one applied to the control gate electrode CG thereof and one applied to the drain region thereof, and a base voltage applied to the p-type well in the upper surface of the semiconductor substrate.

The selected memory cell referred to herein is a memory cell selected as a target in which "writing" "erasing" or "reading" is to be made. In the nonvolatile memory example illustrated in FIG. 13, the extension region EX1 and the diffusion region DF1 that are formed in an active region on the memory-gate-electrode-MG side of each of the memory cells are configured as a source region while the extension region EX2 and the diffusion region DF2 that are formed in an active region on the control-gate-electrode-CG side of the memory cell are configured as a drain region.

The voltage-applying conditions shown in the table of FIG. 15 are a preferred example of voltage-applying conditions. Thus, the voltage-applying conditions are not limited to this example to be variously changeable as required. In the present embodiment, the following are defined as the "writing" and the "erasing", respectively: the injection of electrons into the silicon nitride film N1, which is a charge accumulating part on in the ONO film ON2 (see FIG. 13) of the memory transistor; and the injection of holes into the same.

In the table of FIG. 15, the rows A, B, C and D correspond, respectively, to cases where the method for the writing, and that for the erasing are the following: SSI mode, and BTBT mode; SSI mode, and FN mode; FN mode, and BTBT mode; and FN mode, and FN mode.

The SSI mode can be regarded as an action mode of injecting hot electrons into the silicon nitride film N1 to make writing in the memory cell. The BTBT mode can be regarded as an action mode of injecting hot electrons into the silicon nitride film N1 to make erasing in the memory cell. The FN mode can be regarded as an action mode of making writing or erasing by the tunneling of electrons or holes. In other words, writing in the FN mode can be regarded as an action mode of injecting electrons into the silicon nitride film N1 by FN tunnel effect to make writing in the memory cell; and erasing in the FN mode can be regarded as an action mode of injecting holes into the silicon nitride film N1 by FN tunnel effect to make erasing in the memory cell. Hereinafter, these matters will be specifically described.

The writing mode of such a memory cell is classified into a writing mode (hot electron injection wiring mode) of making writing according to hot electron injection by source side injection, which is named the so-called SSI (source side injection) mode, and a writing mode (tunneling writing mode) of making writing according to FN (Flower Nordheim) tunneling, which is named the so-called FN mode.

In writing in the SSI mode, for example, voltages as shown in the column "Writing action voltage" of the row A or B in the table of FIG. 15 (Vmg=10 V, Vs=5 V, Vcg=1 V, Vd=0.5 V and Vb=0 V) are applied to the respective moieties of the selected memory cell where writing is to be made, so that electrons are injected to the silicon nitride film N1 in the ONO film ON2 of the selected memory cell.

At this time, hot electrons are generated in the channel region (between the source and the drain) below between the two gate electrodes (the memory gate electrode MG and the control gate electrode CG), and the hot electrons are injected into the silicon nitride film N1, which is a charge accumulating part, below the memory gate electrode MG. The injected hot electrons (electrons) are trapped into a trapping level in the silicon nitride film N1 in the ONO film ON2. As a result, the threshold voltage of the memory transistor is raised. In short, the memory transistor turns into a writing state.

In writing in the FN mode, for example, voltages as shown in the column "Writing action voltage" of the row C or D in the table of FIG. 15 (Vmg=−12 V, Vs=0 V, Vcg=0 V, Vd=0 V and Vb=0 V) are applied to the respective moieties of the selected memory cell where writing is to be made, so that in the selected memory cell, electrons are tunneled from the memory gate electrode MG to be injected into the silicon nitride film N1 in the ONO film ON2. In this way, writing is made. At this time, the electrons are tunneled from the memory gate electrode MG through the second oxide silicon film (top oxide film) OX3 by FN tunneling (FN tunnel effect), so as to be injected into the ONO film ON2. The electrons are trapped into a trapping level in the silicon nitride film N1 in the ONO film ON2. As a result, the threshold voltage of the memory transistor is raised. In short, the memory transistor turns into a writing state.

In the FN mode, writing can also be made by tunneling electrons from the semiconductor substrate SB and thus injecting electrons into the silicon nitride film N1. In this case, the writing action voltages may be rendered, for example, voltages obtained by reversing the pluses or minuses of values in the column "Writing action voltages" in the row C or D in the table of FIG. 15.

The erasing mode of such a memory cell is classified into an erasing mode (hot hole injection erasing mode) of making erasing according to hot hole injection by BTBT (band-to-band tunneling), which is named the so-called BTBT mode, and an erasing mode (tunneling erasing mode) of making erasing according to FN (Flower Nordheim) tunneling, which is named the so-called FN mode.

In the BTBT mode, erasing is made by injecting holes generated by BTBT into the charge accumulating part (silicon nitride film Ni). For example, voltages as shown in the column "Erasing action voltage" of the row A or B in the table of FIG. 15 (Vmg=−6 V, Vs=6 V, Vcg=0 V, Vd=open state, and Vb=0 V) are applied to the respective moieties of the selected memory cell where erasing is to be made. In this way, holes are generated by a phenomenon of BTBT, and then accelerated by an electric field to be injected into the silicon nitride film N1 of the selected memory cell. By the injection, the threshold voltage of the memory transistor is lowered. In short, the memory transistor turns into an erasing state.

In erasing in the FN mode, for example, voltages as shown in the column "Erasing action voltage" of the row B or D in the table of FIG. 15 (Vmg=12 V, Vs=0 V, Vcg=0 V, Vd=0 V and Vb=0 V) are applied to the respective moieties of the selected memory cell where erasing is to be made, so that in the selected memory cell, holes are tunneled from the memory gate electrode MG to be injected into the silicon nitride film N1. In this way, erasing is made. At this time, the holes are tunneled from the memory gate electrode MG through the second oxide silicon film (top oxide film) OX3 by FN tunneling (FN tunnel effect) to be injected into the ONO film ON2. The holes are trapped into a trapping level in the silicon nitride film N1 in the ONO film ON2. As a result, the threshold voltage of the memory transistor is lowered. In short, the memory transistor turns into an erasing state.

In the FN mode, erasing can also be made by tunneling holes from the semiconductor substrate SB and thus injecting the silicon nitride film N1. In this case, the erasing action voltages may be rendered, for example, voltages obtained by reversing the pluses or minuses of values in the column "Erasing action voltages" in the row B or D in the table of FIG. 15.

When reading is made, for example, voltages as shown in the column "Reading action voltage" of the row A, B, C or D in the table of FIG. 15 are applied to the respective moieties of the selected memory cell where reading is to be made. The voltage Vmg applied to the memory gate electrode MG at the reading time is set to a value between the threshold voltage of the memory transistor in a writing state and that of the memory transistor in an erasing state, thereby making it possible to distinguish the writing state and the erasing state from each other.

<About Advantageous Effects of Present Embodiment>

Figure 14:
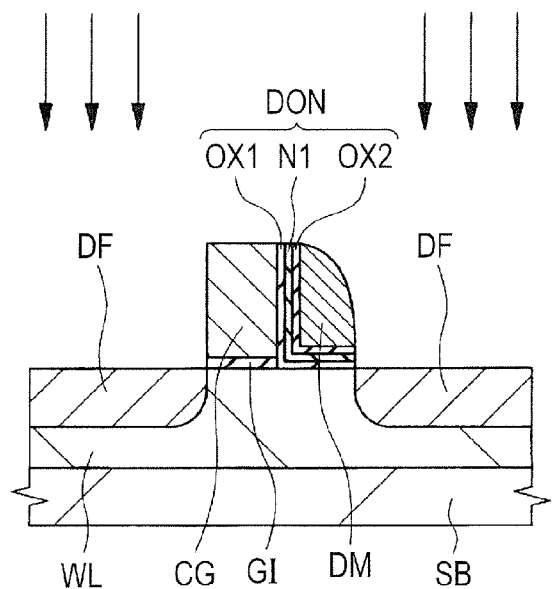
FIG. 14 is a sectional view illustrating a step in a semiconductor device producing method which is a comparative example.

Hereinafter, a description will be made about problems of a semiconductor device of a comparative example illustrated in FIG. 14, and about advantageous effects of the present embodiment. FIG. 14 is a sectional view of this semiconductor device; and with reference to this figure, the action of the comparative example will be described.

In the step of forming each MONOS memory of a split gate type, it is conceivable to form a control gate electrode, an ONO film, a memory gate electrode, and side walls on both sides of these members, and subsequently use the control gate electrode, the ONO film, the memory gate electrode and the side walls as a mask to implant ions into the member-including workpiece to form diffusion regions for source/drain regions. In the ion implantation performed to form the diffusion regions in this step, the dose of the impurity ions and the injecting energy are high so that the impurity ions are injected into the memory gate electrode, which is used as the mask, to spread from the upper surface thereof to a deep region thereof.

At this time, the following cases are caused: a case where the impurity ions hit onto the upper surface of each of the memory gate electrodes reach a middle depth of the memory gate electrode; and a case where the impurity ions hit onto the upper surface of the memory gate electrode pass through the memory gate electrode to reach a region of the ONO film that is just below the memory gate electrode. The injection depth of the impurity ions injected into the memory gate electrode is not even in the whole of the semiconductor wafer (semiconductor substrate) to be varied between the memory gate electrodes. In this case, at the time when the memory gate electrodes will be crystallized by annealing (for example, the annealing after the formation of the source/drain regions, which has been described with reference to FIG. 11) in a subsequent step, a difference is generated between the memory gate electrodes in the shape of crystals (grains) configured as the memory gate electrodes by the difference in impurity distribution between the memory gate electrodes.

In short, between the memory gate electrodes, the particle diameter of the grains configured as these electrodes, and others are varied. Accordingly, even when two or more finished memory cells are caused to act under the same voltage conditions, a situation may be caused that a depletion layer is generated in the bottom of some of the memory gate electrodes while no depletion layer is generated in the others of the memory gate electrodes. Consequently, a difference is generated in threshold voltage between the memory transistors, which include the memory gate electrodes, respectively, so that properties are varied between the memory cells. Thus, the memories come not to act normally to cause a problem that the semiconductor device is deteriorated in reliability.

Such a problem is caused by the respective impurity distributions in the memory gate electrodes at the time of the crystallization. Thus, the problem becomes remarkable, particularly, when a silicon film laid to form the memory gate electrodes is formed as an amorphous silicon film at the time of the formation. Even when the memory gate electrodes are made of a polycrystal silicon film (polysilicon film) before the formation of the diffusion regions, the problem becomes remarkable in a case where the crystal structure of the memory gate electrodes is broken by the ion implantation for forming the diffusion regions, so as to be returned into an amorphous state.

The problem is a problem caused by the impurity concentration difference between the memory gate electrodes. Accordingly, in the case of introducing the impurity ions into the silicon film laid to form the memory gate electrodes when or just after the film is formed, the memory gate electrodes, which are to be formed after introduction, are to be in a state that the impurities are already distributed into a predetermined concentration. Thus, even when impurity ions are to be hit into the memory gate electrodes at the time of forming diffusion regions, a difference should be small in impurity concentration between the memory gate electrodes not to cause the above-mentioned problem easily.

In conclusion, the problem becomes remarkable in the case of implanting ions to the memory gate electrodes for the first time in the ion implanting step of forming extension regions and diffusion regions, when or just after the silicon film is formed, without introducing any impurity ion into the silicon film to form the memory gate electrodes.

In the case of using the memory gate electrodes and others as a mask to attain ion implantation, thereby forming diffusion regions, it is feared that impurity ions penetrate the memory gate electrodes to hit into a top oxide film configured as an ONO film so that the top oxide film is damaged. In this case, the reliability of the top oxide film as an insulating film is deteriorated to cause a problem that a silicon nitride film below the top oxide film is deteriorated in property of holding carriers (for example, electrons) injected into this nitride film. In short, the memory cells are deteriorated in data holding property. Consequently, the memories are lowered in action reliability to cause a problem of lowering the semiconductor device in reliability.

In order to overcome these problems, as illustrated in FIG. 14 as a comparative example, it is conceived that diffusion regions DF are formed in the state that a dummy ONO film DON and each dummy memory gate electrode DM are formed, and subsequently an ONO film and each memory gate electrode is newly formed.

In other words, in this example, each control gate electrode CG and a dummy ONO film DON are formed over a semiconductor substrate SB, and then a dummy memory gate electrode DM is formed in a side wall form to be adjacent to one of the side walls of the control gate electrode CG. Subsequently, the dummy memory gate electrode DM and the control gate electrode CG are used as a mask to implant ions into the workpiece. In this way, a pair of diffusion regions DF is formed on both sides of the dummy memory gate electrode DM and the control gate electrode CG.

At this time, the impurity ions are hit into the dummy memory gate electrode DM to spread from the upper surface of the dummy memory gate electrode DM into the vicinity of the lower surface thereof. Moreover, out of the impurity ions, ions penetrating the dummy memory gate electrode DM give damage to a sacrifice silicon oxide film OX2 as a top oxide film (below the electrode DM). In this example, in a subsequent step, the dummy memory gate electrode DM and the dummy ONO film DON are removed to make the respective outer surfaces of the control gate electrode CG and the semiconductor substrate SB exposed, and subsequently an ONO film (not illustrated) and memory gate electrodes (not illustrated) are newly formed. The gate length of each of the newly formed memory gate electrodes is substantially the same as that of the dummy memory gate electrode DM.

The top oxide film configured as the newly formed ONO film is not damaged by the ion implantation when the diffusion regions DF are formed, and the memory gate electrode does not receive the ion implantation. Accordingly, in the semiconductor device of the comparative example, respective properties of the memory cells can be prevented from being varied between these cells by the difference in impurity distribution between the memory gate electrodes. Furthermore, the data holding property can be prevented from being lowered by the damage of the top oxide film.

However, in the comparative example, the ion implantation is performed in the state that the dummy memory gate electrodes DM are formed which each have a gate length equivalent to that of each of the memory gate electrodes to be finally formed. In this way, the diffusion regions DF are formed. Thus, in the comparative example, the interval between paired ones of the diffusion regions DF is smaller than in the case of performing ion implantation in the state that side walls are formed onto side walls of each memory gate electrode and the corresponding control gate electrode CG, thereby forming diffusion regions. Accordingly, in the comparative example, a current flows easily between the source/drain regions of each of the memory cells to deteriorate the characteristic (cut-off characteristic) of preventing a leakage current between the source/drain regions, that is, the generation of OFF-state current when the memory cell is caused not to act. Thus, a problem is caused that the semiconductor device is lowered in reliability.

The problem becomes more remarkable as the semiconductor device is made finer. Thus, unless this problem is solved, an improvement of the semiconductor device in performance is hindered.

When the whole of an ONO film is again formed after the formation of diffusion regions DF as performed in the comparative example, much heat is applied to the semiconductor substrate SB concerned in the step of forming the new ONO film, so that the diffusion regions DF are spread into a wider scope. Thus, a problem is caused that the cut-off characteristic is further deteriorated. When re-design is made for restraining this deterioration in the cut-off property, considering heat diffusion based on the re-formation of the ONO film, producing costs of the semiconductor device are increased.

In the comparative example, ion implantation is performed using, as a mask, the dummy memory gate electrodes DM each having a gate length equivalent to that of each of the memory gate electrodes remaining after the finish of the memory cells, and the control gate electrodes CG. In this way, the diffusion regions DF are formed; thus, when viewed in plan, each of the diffusion regions DF is formed to overlap partially with the corresponding control gate electrode CG and memory gate electrode, or contact these members.

In other words, when viewed in plan, the diffusion region DF and the control gate electrode CG contact each other not to be apart from each other. In the same manner, when viewed in plan, the diffusion region DF and the memory gate electrode contact each other not to be apart from each other. It therefore becomes difficult that at a position nearer to the channel region, an extension region smaller in impurity concentration than the diffusion region DF is formed than the diffusion region DF is formed.

Thus, it becomes difficult to form an LDD structure. This matter makes it difficult to make the channel of the transistor configured as each of the memory cells short. Against this problem, it is conceivable to form each extension region by implanting ions into a main surface of a semiconductor substrate SB from an oblique direction. However, when the extension region is formed in the comparative example, in which the interval between paired ones of the diffusion regions DF is small, the resistance value between the source/drain regions of the corresponding memory cell is further lowered to cause a problem that the cut-off characteristic is further deteriorated.

By contrast, as has been described with reference to FIGS. 3 to 5, in the semiconductor device producing method of the present embodiment, the silicon film SF2 and the dummy gate electrodes DMF each having a thickness equivalent to a value obtained by adding the gate length of each of the memory gate electrodes MG (see FIG. 11) and the corresponding side wall SW (see FIG. 11), these members MG and SW being to be subsequently formed, to each other. In other words, in the step described with reference to FIG. 5, the ion implantation is performed, using, as a mask, the dummy memory gate electrodes DMG larger in gate length than the memory gate electrodes MG; thus, as has been illustrated in FIG. 8, each of the diffusion regions DF1 can be formed to be apart from the corresponding memory gate electrode MG when viewed in plan. Thus, any one of the extension regions EX1 can be formed in a semiconductor substrate SB main surface region between the diffusion region DF1 and the memory gate electrode MG.

In the present embodiment, the diffusion region DF1 for each of the source regions, and the diffusion region DF2 for the corresponding drain region are not simultaneously formed in the step described with reference to FIG. 5, but as illustrated in FIG. 11, the side walls SW are to be formed in one of the subsequent steps, and subsequently the side walls SW are to be used as a mask to implant the ions into the workpiece to form the diffusion region DF2. Thus, the diffusion region DF2 can be formed at a position apart from the corresponding control gate electrode CG when viewed in plan. Accordingly, each of the extension regions EX2 formed before the formation of the diffusion region DF2 can be caused to remain between one of the channel regions, and the corresponding diffusion region DF2.

Thus, in the present embodiment, an LDD structure can be formed in the source/drain regions configured as portions of each of the memory cells MS (see FIG. 13). Moreover, its diffusion regions DF1 and DF2 can be formed to be sufficiently apart from each other, so that the cut-off characteristic can be prevented from being deteriorated. Additionally, since the diffusion regions DF1 and DF2 can be formed to be sufficiently apart from each other, a deterioration in the cut-off characteristic can be prevented by forming the corresponding extension regions EX1 and EX2. Thus, the resultant semiconductor devices can be improved in reliability.

In order to realize such a structure, it is sufficient for the silicon film SF2 (see FIG. 3) laid to form the dummy memory gate electrodes DMG to have a larger film thickness than the silicon film SF3 (see FIG. 7) laid to form the memory gate electrodes MG.

In the present embodiment, in the state that the dummy memory gate electrodes DMG, which are relatively large in film thickness, the diffusion regions DF1 are formed. Thereafter, the dummy memory gate electrodes DMG are removed, and subsequently the memory gate electrodes MG are newly formed. When the diffusion regions DF2 are formed, the memory gate electrodes MG are covered with the photoresist film PR4 (see FIG. 11). Thus, when ion implantation is performed to form the diffusion regions DF1 and DF2, no impurity ions are introduced into the memory gate electrodes MG. It is therefore possible to prevent the respective properties of the memory cells MC from being varied therebetween by a variation in impurity ion distribution between the memory gate electrodes MG. Thus, the semiconductor devices can be improved in reliability.

In the step illustrated in FIG. 10, the memory gate electrodes MG are used as a mask to perform ion implantation for forming the extension regions EX1. However, the ion implantation is applied to the extension regions EX1 at a lower dose and a lower energy than ion implantation for forming the diffusion regions DF1. Accordingly, the impurity ions hit onto the upper surfaces of the memory gate electrodes MG do not reach the lower surfaces of the memory gate electrodes MG. In short, no variation is generated in impurity ion distribution between the respective bottoms of the memory gate electrodes MG.

It is therefore possible to prevent the generation of a situation that a depletion layer is generated in each of the bottoms of some of the memory gate electrodes while no depletion layer is generated in each of the other memory gate electrodes. As a result, it is possible to prevent the memory cells MC from being varied in properties therebetween by the generation of a difference in threshold voltage between the memory transistors, which include these memory gate electrodes, respectively. Thus, the semiconductor devices can be improved in reliability.

In this embodiment, without removing the whole of the ONO film ON1 (see FIG. 5) to form an ONO film newly, at the time of using the dummy memory gate electrodes DMG as a mask to form the diffusion regions DF1 the sacrifice silicon oxide film (top oxide film) OX2 only is removed, which is a film into which impurity ions are especially easily hit, in the step described with reference to FIG. 6. Thereafter, as has been illustrated in FIG. 7, the second oxide silicon film (top oxide film) OX3 is newly formed; thus, it is possible to prevent any damage by the ion implantation for forming the diffusion regions DF1 from remaining the second oxide silicon film OX3.

It is therefore possible to prevent the following: each of the memory cells MC, which has the ONO film ON2 (see FIG. 13) including the second oxide silicon film OX3, is lowered in data holding property; and the memory cell MC is deteriorated in action reliability. Thus, the semiconductor devices can be improved in reliability.

In the present embodiment, only the top oxide film is re-formed; accordingly, a thermal load imposed onto the semiconductor substrate SB after the formation of the diffusion regions DF1 can be made smaller than in the case of re-forming the whole of the ONO film as performed in the comparative example. Thus, it is possible to prevent the impurity ions inside the diffusion regions DF1 from being further diffused by the formation of the film(s) concerned. Consequently, the memory cells MC can be prevented from being deteriorated in cut-off characteristic, thereby improving the semiconductor devices in reliability.

In the step descried with reference to FIG. 5, portions of the ONO film ON1 that are exposed from the dummy memory gate electrodes DMG and the photoresist film PR1 are damaged by ion implantation. Furthermore, the first silicon oxide film OX1 and the silicon nitride film N1, which are configured as portions of the ONO film ON1, remain in the finished memory cells MC.

If the gate length of each of the dummy memory gate electrodes is equivalent to that of each of the memory gate electrodes to be subsequently formed, and further the firstly-formed ONO film is partially caused to remain without being removed, it is feared that in the ONO film configured as respective portions of the memory cells, damage remains which an ONO film region adjacent to the dummy memory gate electrode receives through the ion implantation for forming the diffusion regions. This is because damage which any region of the ONO film that is exposed from the dummy memory gate electrodes receives remains also in any portion thereof that is adjacent to the exposed portion and is positioned just below the dummy memory gate electrodes.

However, portions of the first silicon oxide film OX1 and the silicon nitride film N1, these portions being further portions receiving damage through ion implantation in the step described with reference to FIG. 5 since these portions are exposed from the dummy memory gate electrodes DMG larger in gate length than the memory gate electrodes MG, are portions positioned in semiconductor-substrate-regions apart from semiconductor-substrate-regions where the memory gate electrodes MG are to be subsequently formed. Moreover, in the step described with reference to FIG. 8, by removing portions of the first silicon oxide film OX1, silicon nitride film N1 and second oxide silicon film OX3 that are exposed from the memory gate electrodes MG, the first silicon oxide film OX1 and the silicon nitride film N1, which have received damage in the step described with reference to FIG. 5, are wholly removed.

In conclusion, regions of the first silicon oxide film OX1 and the silicon nitride film N1 which receive damage through ion implantation in the step described with reference to FIG. 5 are apart from regions of the first silicon oxide film OX1 and the silicon nitride film N1 which are to remain in the subsequent step illustrated in FIG. 8. In other words, regions of the ONO film ON1 which receive damage through ion implantation in the step described with reference to FIG. 5 are apart from regions of the ONO film ON2 that are just below the memory gate electrodes MG and that are to remain after the ONO-film-ON2-partially removing step. Accordingly, the damage can be prevented from remaining the ONO film ON2.

In the semiconductor device producing method of the present embodiment, the above-mentioned advantageous effects can be produced while the memory cells MC (see FIG. 13) are formed without increasing the number of masks to be used from the same number in any method for producing split gate type MONOS memories in which a source region of any memory cell and a drain region thereof are formed through different ion implanting steps. This is because the films configured as the ONO films ON1 and ON2, and the dummy memory gate electrodes DMG can be formed in a self-aligned manner without using any mask.

Furthermore, the above-mentioned advantageous effects can be produced while the memory cells MC are formed without increasing the number of steps to be used from the same number in any case of including: configuring memory cells and forming any source region and any drain region each having an LDD structure through different ion implanting steps; and further re-forming memory gate electrodes and the whole or portions of an ONO film as performed in the comparative example. Thus, the present embodiment can produce the above-mentioned advantageous effects while preventing an increase in costs for producing semiconductor devices.

The above has specifically described the invention made by the inventors by way of the embodiment thereof. However, the invention is not limited to the embodiment. Thus, it is needless to say to change the embodiment variously as far as the changed embodiments do not depart from the subject matters of the invention.

For example, any one of the steps described with reference to FIGS. 9 and 10 may be earlier performed. Moreover, the extension regions EX1 and EX2 illustrated in FIGS. 9 and 10 may be formed through the same ion implanting step.

What is claimed is:

1. A method for producing a semiconductor device, comprising the steps of:
    (a) preparing a semiconductor substrate;
    (b) forming a gate insulating film and a control gate electrode in turn over a main surface of the semiconductor substrate;
    (c) forming a first insulating film including therein a charge holding portion over the semiconductor substrate to cover the control gate electrode;
    (d) forming a first sacrifice film in a side wall form over respective side walls of the control gate electrode on both sides of the control gate electrode to interpose a first insulating film between each of the side walls and the control gate electrode;
    (e) using, as a mask, a portion of the first sacrifice film that is adjacent to one of the side walls of the control gate electrode to implant impurity ions of a predetermined conductivity type into the main surface of the semiconductor substrate, thereby forming a first semiconductor region;
    (f) removing, after the step (e), the first sacrifice film;
    (g) forming a memory gate electrode at a position adjacent to one of the side walls of the control gate electrode, the side wall being the first-semiconductor-region-side side wall;
    (h) removing a portion of the first insulating film that is exposed from the memory gate electrode;
    (i) forming a second semiconductor region of the conductivity type over a region out of main surface regions of the semiconductor substrate that are adjacent to the control gate electrode, the region being a main surface region opposite to a memory-gate-electrode-positioned region of these main surface regions, and forming a third semiconductor region of the conductivity type over a main surface region of the semiconductor substrate, the region being between the memory gate electrode and the first semiconductor region; and
    (j) forming a fourth semiconductor region of the conductivity type over a main surface region of the semiconductor substrate, the main surface region being on a side of the control gate electrode and being opposite to the memory-gate-electrode-positioned region of the main surface;
    wherein the second and third semiconductor regions are smaller in impurity concentration than the first and fourth semiconductor regions; and
    wherein the first, second, third and fourth semiconductor regions, the control gate electrode, and the memory gate electrode are configured as a memory cell of a nonvolatile memory.

2. The method for producing a semiconductor device according to claim 1,
    wherein in a direction of the gate length of the control gate electrode, the width of the first sacrifice film is larger than the gate length of the memory gate electrode.

3. The method for producing a semiconductor according to claim 1,
    wherein in the step (c), the first insulating film is formed to include a second insulating film, a charge accumulating film, and a second sacrifice film that are formed in this order over the semiconductor substrate,
    wherein in the step (f), the first sacrifice film and the second sacrifice film are removed, and
    wherein after the step (f) and before the step (g), a third insulating film is formed which covers the charge accumulating film.

4. The method for producing a semiconductor according to claim 3,
    wherein after the step (j), the third insulating film is smaller in impurity concentration than the charge accumulating film.

5. The method for producing a semiconductor according to claim 1,
    wherein after the step (j), the ratio of the concentration of phosphorus to that of arsenic in the memory gate electrode is smaller than the ratio of the concentration of phosphorus to that of arsenic in the first insulating film.

6. The method for producing a semiconductor according to claim 1,
wherein the second and third semiconductor regions are smaller in region-formed depth than the first and fourth semiconductor regions.

7. The method for producing a semiconductor according to claim 1,
wherein in the step (i), the second and third semiconductor regions are formed by implanting ions to the main surface of the semiconductor substrate, and
wherein in the steps (e) and (j), the first and fourth semiconductor regions are each formed by the ion implantation, or ion implantation at a higher energy than by the ion implantation performed in the step (i).

8. The method for producing a semiconductor according to claim 1,
further comprising, after the step (i) and before the step (j), the step (j1) of forming a fourth insulating film which is in a side wall form and which is adjacent to one of the side walls of the control gate electrode, the side wall being a side wall opposite to the memory-gate-electrode-side side wall.

9. The method for producing a semiconductor according to claim 1,
wherein in the step (j), the fourth semiconductor region is formed in a state that the memory gate electrode is covered with a protective film.

10. The method for producing a semiconductor according to claim 1,
wherein after the step (j), the memory gate electrode is smaller in impurity concentration than the first semiconductor region.

11. The method for producing a semiconductor according to claim 1,
wherein in the step (e), the position of a region of the first insulating film that is exposed from the first sacrifice film is apart from a region of the first insulating film that is positioned just below the memory gate electrode in the step (h).

12. The method for producing a semiconductor according to claim 1,
wherein in the step (g), the memory gate electrode is formed in an amorphous state.

13. The method for producing a semiconductor according to claim 1,
wherein the memory gate electrode formed in the step (g) comprises an intrinsic semiconductor.

14. The method for producing a semiconductor according to claim 1,
wherein the step (i) comprises the steps of:
(i1) forming the second semiconductor region of the conductivity type by applying ion implantation to the main surface region of the semiconductor substrate, the region being on the side of the control gate electrode and being opposite to the memory-gate-electrode-positioned region of the main surface; and
(i2) forming the third semiconductor region of the conductivity type by applying ion implantation to the main surface region of the semiconductor substrate, the region being between the memory gate electrode and the first semiconductor region, by use of the memory gate electrode as a protective film.

* * * * *